(12) United States Patent
Wakita et al.

(10) Patent No.: US 9,206,310 B2
(45) Date of Patent: Dec. 8, 2015

(54) MODIFIER FOR RESIN AND RESIN COMPOSITION USING THE SAME AND FORMED ARTICLE

(71) Applicant: MITSUBISHI RAYON CO., LTD., Tokyo (JP)

(72) Inventors: Tsuneki Wakita, Otake (JP); Keiji Nakamura, Otake (JP); Hideaki Makino, Toyohashi (JP); Masahiro Osuka, Kawasaki (JP); Yohei Miwa, Toyohashi (JP); Yasutaka Doi, Toyohashi (JP)

(73) Assignee: MITSUBISHI RAYON CO., LTD., Tokyo (JP)

( * ) Notice: Subject to any disclaimer, the term of this patent is extended or adjusted under 35 U.S.C. 154(b) by 0 days.

(21) Appl. No.: 14/219,808

(22) Filed: Mar. 19, 2014

(65) Prior Publication Data

US 2014/0206817 A1   Jul. 24, 2014

Related U.S. Application Data

(62) Division of application No. 10/589,501, filed as application No. PCT/JP2005/002210 on Feb. 15, 2005, now abandoned.

(30) Foreign Application Priority Data

Feb. 16, 2004  (JP) .................................. 2004-037784
Apr. 5, 2004    (JP) .................................. 2004-110913

(51) Int. Cl.

| C08L 51/00 | (2006.01) |
|---|---|
| C08L 51/04 | (2006.01) |
| C08L 63/00 | (2006.01) |
| C08F 265/04 | (2006.01) |
| C08F 279/02 | (2006.01) |
| C08F 283/12 | (2006.01) |
| C08L 33/04 | (2006.01) |
| C08L 51/08 | (2006.01) |
| H01L 23/29 | (2006.01) |

(52) U.S. Cl.

CPC ............ *C08L 63/00* (2013.01); *C08F 265/04* (2013.01); *C08F 279/02* (2013.01); *C08F 283/12* (2013.01); *C08L 33/04* (2013.01); *C08L 51/003* (2013.01); *C08L 51/085* (2013.01); *H01L 23/293* (2013.01); *H01L 2924/0002* (2013.01)

(58) Field of Classification Search

CPC ..... C08L 51/00; C08L 51/003; C08L 51/006; C08L 51/04; C08L 51/05; C08L 51/08; C08L 51/085; C08L 63/00; C08L 63/04; C08L 63/06; C08L 63/08; C08L 63/10
See application file for complete search history.

(56) References Cited

U.S. PATENT DOCUMENTS

| 3,988,393 | A |   | 10/1976 | Gallagher |
|---|---|---|---|---|
| 5,017,631 | A |   | 5/1991 | Rauch et al. |
| 5,312,575 | A | * | 5/1994 | Wills ............................ 264/109 |
| 6,051,650 | A |   | 4/2000 | Endo et al. |
| 6,331,580 | B1 | * | 12/2001 | Molnar ......................... 523/201 |
| 7,335,703 | B2 |   | 2/2008 | Fukui |
| 2001/0016612 | A1 |   | 8/2001 | Kasai |
| 2002/0013410 | A1 |   | 1/2002 | Mizuta et al. |
| 2002/0072566 | A1 | * | 6/2002 | Wills et al. ...................... 525/50 |
| 2003/0018132 | A1 |   | 1/2003 | Usui et al. |

FOREIGN PATENT DOCUMENTS

| CA | 1 324 453 |   | 11/1993 |
|---|---|---|---|
| DE | 37 19 241 | A1 | 12/1988 |
| EP | 0 294 663 | A2 | 12/1988 |
| EP | 0 985 692 | A2 | 3/2000 |
| EP | 1 162 217 |   | 12/2001 |
| EP | 1 440 997 | A1 | 7/2004 |
| EP | 1 650 252 | A1 | 4/2006 |
| JP | 62-22825 | A | 1/1987 |
| JP | 64-001731 |   | 1/1989 |
| JP | 11-035873 | A | 2/1999 |
| JP | 2000-007890 |   | 1/2000 |
| JP | 2001-329067 |   | 11/2001 |
| JP | 2002-226596 |   | 8/2002 |
| JP | 2003-2978 | A | 1/2003 |
| JP | 2003-26890 | A | 1/2003 |
| JP | 2004-231916 | A | 8/2004 |
| WO | WO 00/01748 |   | 1/2000 |
| WO | WO01/88021 |   | 11/2001 |

\* cited by examiner

*Primary Examiner* — Ana Woodward
(74) *Attorney, Agent, or Firm* — Oblon, McClelland, Maier & Neustadt, L.L.P.

(57) ABSTRACT

A modifier for resin has an average particle size of 20 μm or more, wherein particles having an average particle size of 10 μm or less account for less than 30% by mass of the modifier, and particles having an average particle size of 10 μm or less account for 30% by mass or more of the modifier after irradiating the modifier with ultrasonic wave of 40 W for 5 minutes. Also a resin composition comprises 1 to 40% by mass of the modifier for resin and 99 to 60% by mass (the total amount of both components is 100% by mass) of a thermoplastic resin or a curable resin, and a molded article is produced by molding the same.

6 Claims, No Drawings

MODIFIER FOR RESIN AND RESIN COMPOSITION USING THE SAME AND FORMED ARTICLE

This application is a Continuation/Divisional of U.S. application Ser. No. 10/589,501, filed on Jan. 16, 2007, now abandoned.

TECHNICAL FIELD

The present invention relates to a modifier for resin, which exhibits excellent dispersibility to a curable resin or a thermoplastic resin.

BACKGROUND ART

Resin products are produced according to purposes such as electric and electronic products, automobiles and building materials. To exhibit performances required according to the purposes, one or several kinds of resins and additives are added to the molded articles. These resins often require high toughness and a modifier for resin is added so as to impart impact strength required to end uses of the resin products.

Usually, this modifier for resin is supplied in the form of a powder. Therefore, dispersion of the modifier into a matrix resin becomes very important element and, when poor dispersion occurs, sufficient modification effect is not obtained and inclusion composed of extraordinary substance of the modifier is formed in appearance. Dispersion of the modifier for resin is particularly important element in electric and electronic components, solder pastes and coating materials. Particularly, it is necessary condition for a modifier for semiconductor sealing material to cause no poor dispersion due to the thinning and fine patterning of a package with recent high degree of functioning and high degree of integration of a semiconductor device.

As a method of imparting the strength to a semiconductor sealing material, a method of adding a rubber such as MBS resin to an epoxy resin has been proposed (see, for example, Patent Documents 1 and 2).

Patent Document 1: Japanese Unexamined Patent Application, First Publication No. 2000-7890

Patent Document 2: Japanese Unexamined Patent Application, First Publication No. S62-22825

DISCLOSURE OF THE INVENTION

Problems to be Solved by the Invention

However, the modifier for resin is not insufficient in dispersibility in a molding method in which processing is conducted under low shear. For example, when the modifier is added to a sealing epoxy resin, poor dispersion occurs and the resin itself may be cracked or fractured by thermal stress produced during a soldering treatment.

The present invention has been made so as to provide a modifier for resin, which exhibits excellent dispersibility when added to a thermoplastic resin or a curable resin, and also can impart impact resistance, matting properties or thickening properties.

The gist of the present invention lies in a modifier for resin having an average particle size of 20 µm or more, wherein particles having an average particle size of 10 µm or less account for less than 30% by mass of the modifier, and particles having an average particle size of 10 µm or less account for 30% by mass or more of the modifier after irradiating the modifier with ultrasonic wave of 40 W for 5 minutes.

Also the gist of the present invention lies in a resin composition comprising 1 to 40% by mass of the modifier for resin and 99 to 60% by mass (the total amount of both components is 100% by mass) of a thermoplastic resin or a curable resin.

Also the gist of the present invention lies in a molded article which is produced by molding the same.

Effects of the Invention

The modifier for resin of the present invention is excellent in dispersibility when added to a thermoplastic resin or a curable resin and is excellent in appearance in the product, and also can impart sufficient impact strength.

Also a resin composition prepared by mixing the modifier for resin of the present invention with a thermoplastic resin or a curable resin can be applied to IC sealing agents, solder pastes and molded articles.

Furthermore, when the modifier for resin of the present invention is mixed with a curable resin composition, gloss is not increased even by friction and a matted coating film with excellent adhesion of a recoated coating film can be formed. Also the modifier for resin of the present invention exhibits excellent thickening properties to a nonaqueous coating material.

BEST MODE FOR CARRYING OUT THE INVENTION

Although the structure of the modifier for resin of the present invention is not specifically limited, a graft copolymer is preferably used. The graft copolymer is not specifically limited as far as it has a so-called core-shell type structure formed by using a rubbery polymer as a trunk polymer and grafting the rubbery polymer with a graft polymerizable vinyl-based monomer.

The rubbery polymer is not specifically limited and there can be used those, which are commonly used, such as diene-based rubber, acrylic rubber, silicone-based rubber or silicone-acrylic composite rubber. Among these, an acrylic rubber is preferably used because a modifier for resin having high dispersibility is obtained.

The diene-based rubber can be obtained by polymerizing 1,3-butadiene and, if necessary, at least one vinyl-based monomer copolymerizable with 1,3-butadiene. Examples of the vinyl-based monomer include aromatic vinyl such as styrene or α-methylstyrene; alkyl methacrylate ester such as methyl methacrylate or ethyl methacrylate; alkyl acrylate ester such as ethyl acrylate or n-butyl acrylate; unsaturated nitrile such as acrylonitrile or methacrylonitrile; vinyl ether such as methyl vinyl ether or butyl vinyl ether; vinyl halide such as vinyl chloride or vinyl bromide; vinylidene halide such as vinylidene chloride or vinylidene bromide; and vinyl-based monomer having a glycidyl group, such as glycidyl acrylate, glycidyl methacrylate, allyl glycidyl ether or ethylene glycol glycidyl ether.

Furthermore, it is possible to use in combination with crosslinkable monomers, for example, aromatic polyfunctional vinyl compound such as divinylbenzene or divinyltoluene; polyhydric alcohol such as ethylene glycol dimethacrylate or 1,3-butanediol diacrylate; trimethacrylate; triacrylate; allyl carboxylate ester such as allyl acrylate or allyl methacrylate; and di- and triallyl compounds such as diallyl phthalate, diallyl sebacate and triallyltriazine.

One or more kinds of vinyl-based monomers and crosslinkable monomers can be used. As a chain transfer agent, t-dodecylmercaptan, n-octylmercaptan and α-methylstyrene can be used. Preferably, t-dodecylmercaptan can be used.

As a method of polymerizing a butadiene-based rubber, an emulsion polymerization method is preferably used. A polymerization initiator is not specifically limited and there can be used a redox-based initiator containing, as a component, a water soluble persulfuric acid such as potassium persulfate, sodium persulfate or ammonium persulfate, or a organic peroxide such as diisopropylbenzene hydroperoxide, p-menthane hydroperoxide, cumene hydroperoxide or t-butyl hydroperoxide, or a combination of the peroxide and at least one reducing agent. The polymerization can be appropriately conducted at a temperature within a range from about 40 to 80° C., although it depends on the kind of the polymerization initiator. As an emulsifier, known emulsifiers can be appropriately used, and monostage or multistage seed polymerization can be employed. According to circumstances, soap-free polymerization may be employed. It is also possible to prepare using a method of enlarging a rubber latex obtained in case of controlling the particle size with an acid or a salt.

The acrylic rubber can be prepared by polymerizing one or more kinds of alkyl(meth)acrylates with one or more kinds of vinyl-based monomers copolymerizable with the alkyl(meth) acrylates.

The alkyl(meth)acrylate is not specifically limited and examples thereof include methyl acrylate, ethyl acrylate, n-propyl acrylate, n-butyl acrylate, i-butyl acrylate, 2-ethylhexyl acrylate, 2-ethylhexyl methacrylate, ethoxyethoxy ethyl acrylate, methoxytripropylene glycol acrylate, 4-hydroxybutyl acrylate, lauryl methacrylate and stearyl methacrylate.

The monomer may include 20% by mass or less, and preferably 0.1 to 18% by mass of a monomer having two or more unsaturated bonds in the molecule. The monomer having two or more unsaturated bonds in the molecule serves as a crosslinking agent or a graft-crosslinking agent, and examples of the crosslinking agent include ethylene glycol dimethacrylate, propylene glycol dimethacrylate, 1,3-butylene glycol dimethacrylate, 1,4-butylene glycol dimethacrylate, divinylbenzene, and silicone such as polyfunctional methacryl group-modified silicone. Examples of the graft-crosslinking agent include allyl methacrylate, triallyl cyanurate and triallyl isocyanurate. The allyl methacrylate can also be used as the crosslinking agent. These crosslinking agents and graft-crossing agents are respectively used alone or in combination.

The monomer may contain, as a copolymer component, 30% by mass or less of various vinyl-based monomers, for example, aromatic alkenyl compound such as styrene, α-methylstyrene or vinyltoluene, vinyl cyanide compound such as acrylonitrile or methacrylonitrile, methacrylic acid-modified silicone and fluorine-containing vinyl compound.

The acrylic rubber may have a single-layered, or two- or multi-layered structure. Also the acrylic rubber may be a polyalkyl(meth)acrylate-based composite rubber which contains two or more kinds of components and has two or more glass transition temperatures.

The polymerization method and the polymerization conditions in case of polymerizing the acrylic rubber are not specifically limited. The polymerization method to be employed is usually an emulsion polymerization method, and preferably a soap-free emulsion polymerization method. If necessary, a forced emulsion polymerization may be employed.

The polymerization initiator is not specifically limited and there can be used a redox-based initiator containing, as a component, a water soluble persulfuric acid such as potassium persulfate, sodium persulfate or ammonium persulfate, or a organic peroxide such as diisopropylbenzene hydroperoxide, p-menthane hydroperoxide, cumene hydroperoxide or t-butyl hydroperoxide, or a combination of the peroxide and at least one reducing agent.

The emulsifier is not specifically limited and, if necessary, one or more alkali metal salts of higher fatty acid such as disproportionated rosin acid, oleic acid or stearic acid, and one or more sulfonic acid alkali metal salts such as dodecylbenzenesulfonic acid can be added.

It is also possible to prepare using a method of enlarging a rubber latex obtained in case of controlling the particle size with an acid or a salt.

The silicone-based rubber is not specifically limited and polyorganosiloxane having a vinyl polymerizable functional group is preferably used.

Examples of dimethylsiloxane used to prepare the polyorganosiloxane include 3- to multi-membered ring dimethylsiloxane-based cyclic compound, and 3 to 7-membered ring compounds are preferable. Specific examples thereof include hexamethylcyclotrisiloxane, octamethylcyclotetrasiloxane, decamethylcyclopentasiloxane and dodecamethylcyclohexasiloxane, and these dimethylsiloxanes are used alone or in combination.

The vinyl polymerizable functional group-containing siloxane has a vinyl polymerizable functional group and is capable of bonding with the dimethylsiloxane via a siloxane bond, and various alkoxysilane compounds having a vinyl polymerizable functional group are preferable taking account of reactivity with the dimethylsiloxane. Specific examples thereof include methacryloyloxysilane such as β-methacryloyloxy ethyldimethoxymethylsilane, γ-methacryloyloxy propyldimethoxymethylsilane, γ-methacryloyloxy propylmethoxydimethylsilane, γ-methacryloyloxy propyltrimethoxysilane, γ-methacryloyloxy propylethoxy diethylsilane, γ-methacryloyloxy propylethoxy diethoxymethylsilane or δ-methacryloyloxybutyl diethoxymethylsilane; vinylsiloxane such as tetramethyl tetravinylcyclotetrasiloxane; vinylphenylsilane such as p-vinylphenyl dimethoxymethylsilane; and mercaptosiloxane such as γ-mercaptopropyl dimethoxymethylsilane or γ-mercaptopropyl trimethoxysilane. These vinyl polymerizable functional group-containing siloxanes can be used alone or in combination.

As a siloxane-based crosslinking agent, there can be used trifunctional or tetrafunctional silane-based crosslinking agent, for example, trimethoxymethylsilane, triethoxyphenylsilane, tetramethoxysilane, tetraethoxysilane and tetrabutoxysilane.

The polyorganosiloxane can be prepared, for example, by forming a latex, which is obtained by emulsifying a mixture of a diorganosiloxane and a vinyl polymerizable functional group-containing siloxane or a mixture further containing a siloxane-based crosslinking agent optionally using an emulsifier and water, into fine particles using a homomixer for forming into fine particles through a shear force produced during high-speed rotation or a homogenizer for forming into fine particles through a jetting force produced by a pressure generator; polymerizing the resulting fine particles at high temperature using an acid catalyst; and neutralizing an acid with an alkali substance.

Examples of the method of adding an acid catalyst used in the polymerization include a method of mixing a siloxane mixture, an emulsifier and water and a method of adding dropwise a latex obtained by forming a siloxane mixture into fine particles in an aqueous acid solution at high temperature at a fixed rate. Taking account of ease of controlling the particle size of polyorganosiloxane, the method of adding dropwise a latex obtained by forming a siloxane mixture into fine particles in an aqueous acid solution at high temperature at a fixed rate is preferable.

Examples of the method of mixing a siloxane mixture, an emulsifier, water and/or an acid catalyst include a method of mixing under high-speed stirring and a method of mixing using a high-pressure emulsification apparatus such as homogenizer, and the method of using a homogenizer is a preferable method because particle size distribution of a polyorganosiloxane latex decreases.

The emulsifier used in the preparation of polyorganosiloxane is preferably an anionic emulsifier, and an emulsifier selected from among sodium alkylbenzenesulfonate, sodium polyoxyethylenenonylphenylether sulfate, and the like is used. Particularly, sodium alkylbenzenesulfonate and sodium lauryl sulfate are preferable.

Examples of the acid catalyst used in the polymerization of the polyorganosiloxane include sulfonic acids such as aliphatic sulfonic acid, aliphatic substituted benzenesulfonic acid and aliphatic substituted naphthalenesulfonic acid, and mineral acids such as sulfuric acid, hydrochloric acid and nitric acid. These acid catalysts can be used alone or in combination.

The polymerization can be terminated by cooling the reaction solution and neutralizing the latex with an alkali substance such as sodium hydroxide, potassium hydroxide or sodium carbonate.

In the present invention, a silicone/acrylic composite rubber obtained by combining the silicone rubber with an alkyl (meth)acrylate rubber can also be used. The silicone/acrylic composite rubber can be prepared by adding an alkyl(meth)acrylate component in a latex of a polyorganosiloxane component and polymerizing the mixture in the presence of a conventional radical polymerization initiator. Examples of the method of adding the alkyl(meth)acrylate include a method of mixing with a latex of a polyorganosiloxane component at a time and a method of adding dropwise in a latex of a polyorganosiloxane component at a fixed rate. Taking account of impact resistance of the resulting resin composition containing a graft copolymer, the method of mixing with a latex of a polyorganosiloxane component at a time is preferable.

Examples of the alkyl(meth)acrylate include alkyl acrylate such as methyl acrylate, ethyl acrylate, n-propyl acrylate, n-butyl acrylate or 2-ethylhexyl acrylate, and alkyl methacrylate such as hexyl methacrylate, 2-ethylhexyl methacrylate or n-lauryl methacrylate, and these alkyl(meth)acrylates can be used alone or in combination. Taking account of impact resistance and molding gloss of the resin composition containing the graft copolymer, n-butyl acrylate is particularly preferably.

Examples of the polyfunctional alkyl(meth)acrylate include allyl methacrylate, ethylene glycol dimethacrylate, propylene glycol dimethacrylate, 1,3-butylene glycol dimethacrylate, 1,4-butylene glycol dimethacrylate, triallyl cyanurate and triallyl isocyanurate, and these polyfunctional alkyl(meth)acrylates can be used alone or in combination.

The radical polymerization initiator used in the polymerization is a peroxide, an azo-based initiator, or a redox-based initiator comprising an oxidizing agent and a reducing agent. Among these radical polymerization initiators, a redox-based initiator is preferable and an initiator comprising ferrous sulfate, disodium ethylenediaminetetraacetate, Rongalite and hydroperoxide is preferable.

The graft copolymer latex used in the modifier for resin of the present invention is obtained by adding one or more kinds of copolymerizable vinyl-based monomers in the presence of a rubber polymer latex containing one or more kinds of components selected from among the diene-based rubber, the acrylic rubber, the silicone-based rubber and the silicone-acrylic composite rubber, followed by graft polymerization.

In the present invention, the monomer used in the graft polymerization is not specifically limited as far as it is copolymerizable with a rubber polymer. For example, there can be used a monomer mixture of aromatic vinyl such as styrene, α-methylstyrene, or various halogen-substituted and alkyl-substituted styrenes; alkyl methacrylate ester such as methyl methacrylate or ethyl methacrylate; alkyl acrylate ester such as ethyl acrylate or n-butyl acrylate; unsaturated nitrile such as acrylonitrile or methacrylonitrile; vinyl-based monomer having a glycidyl group, such as glycidyl acrylate, glycidyl methacrylate, allyl glycidyl ether or ethylene glycol glycidyl ether; and vinyl-based monomer having a hydroxy group such as hydroxymethacrylate, with the above-mentioned crosslinkable monomer and/or a chain transfer agent. If necessary, these monomer mixtures can be subjected to monostage, or two- or multistage graft polymerization according to balance between dispersibility and impact strength.

In the graft copolymer used in the modifier for resin of the present invention, when the sum of the total amount of the monomers used in the graft polymerization and the amount of the rubber polymer is 100% by mass, the total amount of the monomers used in the graft polymerization is preferably from 5 to 50% by mass. When the total amount of the monomers used in the graft polymerization is more than 50% by mass, the resulting product tends to be inferior in impact resistance. On the other hand, when the total amount is less than 5% by mass, the resulting product tends to be inferior in dispersibility.

The graft copolymer used in the modifier for resin of the present invention is preferably a graft copolymer in which a glass transition temperature (Tg) of a core component is preferably within a range from −150 to 10° C., and more preferably from −70 to −20° C., in view of an improvement in impact strength. In view of dispersibility, it is preferred to use a graft copolymer in which Tg of a shell component is within a range from 30 to 150° C., and more preferably from 40 to 130° C. As used herein, Tg of the polymer is measured as a transition point of Tan δ as measured by a dynamic mechanical property analyzer (hereinafter abbreviated to DMA).

The graft copolymer used in the modifier for resin of the present invention is recovered by spray drying of a latex obtained by the polymerization. At this time, a graft polymer having an average particle size of 200 nm or more in the latex obtained finally so as to improve dispersibility in a thermoplastic resin and a curable resin. When the average particle size is less than 200 nm, primary particles of the resulting modifier for resin are fused and good dispersibility cannot be exhibited. Similarly, in view of control of powder dispersibility, particle size distribution of latex particles is preferably narrowed as possible. Although no problem arise when particles having an average particle size of 150 nm or less are present, the content is preferably small as possible.

If necessary, proper antioxidants and additives can be previously added to the graft copolymer latex.

The resulting copolymer latex is powderized by drying using a spray drying method. The spray drying method comprises the steps of spraying a latex to form minute droplets and drying the minute droplets with blowing hot blast. The apparatus to be used is not specifically limited and, as a method of forming droplets, for example, there can be used any of rotary disk type, pressure nozzle type, two fluid nozzle type and pressure two fluid nozzle type apparatuses. Capacity of the dryer is not specifically limited and a small scale of a dryer used in a laboratory or a large scale dryer for industrial use can be used.

The position of an inlet portion as a portion for supplying a heating gas for drying in the dryer, and the position of an outlet portion as a port for discharging the heating gas for drying and a dry powder may be the same as those in a spray dryer used conventionally, and are not specifically limited. The temperature of hot blast to be introduced into the dryer (hot-air inlet temperature), that is, maximum temperature of hot blast which can be contacted with the graft copolymer is preferably 200° C. or lower, and particularly preferably from 120 to 180° C.

In case of spray drying, the graft polymer latex may be used alone or a mixture of plural latexes may also be used. Furthermore, spray drying can be conducted by adding inorganic filler (for example, silica, talc and calcium carbonate), polyacrylate, polyvinyl alcohol and polyacrylamide so as to improve powder properties such as blocking, and bulk specific gravity on spray drying. Spray drying can also be conducted by adding proper antioxidants and additives to a latex to be sprayed.

In the modifier for resin obtained under the above spraying conditions, particles having an average powder particle size of 20 μm or more and 10 μm or less account for less than 30% by mass. Particles having an average powder particle size of 10 μm or less preferably account for 20% by mass, and most preferably 10% by mass or less in view of handling property. The average particle size of the modifier for resin is preferably 200 μm or less.

The modifier for resin of the present invention has a structure that primary particles in the graft copolymer latex are coagulated without being completely fused and particles having an average particle size of 10 μm or less account for 30% by mass or more of the modifier after irradiating the modifier with ultrasonic wave of 40 W for 5 minutes. A modifier for resin in which particles having an average particle size of 10 μm or less account for 40% by mass or more of the modifier after irradiating the modifier with ultrasonic wave of 40 W for 5 minutes is preferable, and a modifier for resin in which particles having an average particle size of 10 μm or less account for 50% by mass or more of the modifier after irradiating the modifier with ultrasonic wave of 40 W for 5 minutes is most preferable.

Irradiation with ultrasonic wave is conducted after diluting the resulting powder with distilled water. For example, after irradiating with ultrasonic wave (40 W) for 5 minutes using a laser diffraction scattering type particle size distribution measuring apparatus (manufactured by NIKKISO CO., LTD. under the trade name of Microtrac MT3000, concentration range is automatically calculated by an apparatus), the proportion (% by weight) of particles having a particle size of 10 μm or less is measured.

The curable resin and the thermoplastic resin used in the resin composition of the present invention are not specifically limited and any resins can be used as far as they are known resins. The curable resin includes a thermosetting resin and a photocurable resin. Examples of the thermosetting resin include epoxy-based resin, phenolic resin, unsaturated polyester-based resin, melamine resin and urea resin. These resins can be used after mixing. The modifier for resin of the present invention is preferably used in an epoxy-based resin among these thermosetting resins.

As the epoxy resin, various known resins can be used and the molecular structure and molecular weight are not specifically limited if the epoxy resin has at least two epoxy bonds in the molecule. For example, various epoxy resins such as dicyclopentadiene type, cresol novolak type, phenol novolak type, bisphenol type and biphenyl type epoxy resins can be used alone or in combination. Examples of the curing agent include phenolic curing agent (for example, phenol novolak resin or cresol novolak resin), amine-based curing agent and acid anhydride curing agent. These curing agents may be used in combination. The amount of the curing agent to be added is not specifically limited, but must be a stoichiometric amount for curing of an epoxy resin.

As the phenol resin, various known phenol resins can be used and examples thereof include resol type or novolak type phenol resins which are derived from various phenols and formaldehyde or aldehyde having at least two carbon atoms. These phenol resins may be modified with drying oil, xylene resin or melamine resin. In case of the novolak type phenol resin, a polyamine such as hexamine, and a curing agent such as epoxy resin, isocyanate compound, polyformaldehyde compound or resol type phenol resin is further used in combination.

As the unsaturated polyester resin, various known unsaturated polyester resins can be used. For example, it is obtained by reacting a saturated dibasic acid such as isophthalic acid, ortho-phthalic acid, phthalic anhydride, succinic acid, adipic acid, sebacic acid, or endomethylenetetrahydrophthalic anhydride; a polyhydric alcohol such as ethylene glycol dipropylene glycol, 1,3-butanediol, hydrogenated bisphenol A, neopentyl glycol, isopentyl glycol or 1,6-hexanediol, and unsaturated dibasic acid such as maleic acid, maleic anhydride, fumaric acid or itaconic acid at a temperature within a range from 180 to 250° C. As the copolymerizable monomer, for example, there can be used a monomer, which is copolymerizable with an unsaturated polyester resin such as styrene, t-butylstyrene, chlorostyrene, divinylbenzene, diallyl phthalate, vinyltoluene or acrylate esters and also has an unsaturated group, or a prepolymer thereof.

If necessary, the curable resin composition can be used in combination with various known additives. For example, there can be used various curing accelerators; releasants such as silicone oils, natural waxes, and synthetic waxes, and metal salts, acid amides and esters of a linear fatty acid, and paraffins; powders such as crystalline silica, fused silica, calcium silicate, alumina, calcium carbonate, talc and barium sulfate, inorganic fillers such as glass fiber and carbon fiber, flame retardants such as chlorinated paraffin, bromotoluene, hexabromobenzene and antimony trioxide, colorants such as carbon black and iron red, and silane coupling agents.

The method of preparing a curable resin composition is not specifically limited and a known technique can be used. For example, the composition is mixed in a solution state or melt-mixed using a mixing roll or a kneader, ground or compressed and then molded by a transfer molding, a sheet a compound molding or a bulk molding method. Furthermore, the resulting product can be used as a coating material and an adhesive composition.

Examples of the molded article obtained by using the curable resin composition of the present invention include electric and electronic molding materials including an IC sealing materials, automotive molding materials and molding materials for building materials, and also include coating materials, adhesives, and solder pastes for circuit board protective film. The modifier for resin of the present invention exhibits excellent thickening properties to a nonaqueous coating material.

The modifier for resin of the present invention may be added to the coating material in the process of kneading a pigment, or may be added after preparing a coating material.

The addition temperature is not specifically limited and a disperser used commonly in the preparation of the coating material can be used.

The use of the modifier for resin of the present invention makes it possible to cope with requirements such as sag resistance and promotion of efficiency of the step of preparing a corrosion-resistant coating material such as epoxy coating material or an urethane coating material.

Examples of the thermoplastic resin used in the present invention include polycarbonate-based resin, crystalline or noncrystalline polyester-based resin, polyamide-based resin, polyacetal-based resin, polyphenylene ether-based resin, polyvinyl chloride-based resin, polystyrene-based resin, polymethyl methacrylate-styrene-based resin, polyalkyl (meth)acrylate-based resin, polyacrylonitrilestyrene-based resin, polyacrylonitrile-butadiene-styrene-based resin and polyolefin-based resin. These thermoplastic resins can be used alone or in combination.

To the thermoplastic resin composition, stabilizer to heat or light, for example, phenol-based, phosphite-based and sulfur-based stabilizers, ultraviolet absorbers, amine-based photostabilizers may be added. Also hydrolysis-resistant modifiers such as epoxy-based modifiers may be added. Furthermore, known flame retardants, fillers such as titanium oxide and talc, dyes and pigments, and plasticizer can be added, if necessary.

The method is not specifically limited and examples thereof include various known methods, for example, a method of mixing powders and granules using a Henschel mixer or a tumbler and melt-mixing using an extruder, a kneader or a mixer, a method of successively mixing other components with a component melted previously, and a method of directly molding a mixture using an injection molding machine. In addition to injection molding, calendar molding, blow molding, extrusion molding, thermomolding, foam molding and melt spinning can be exemplified.

EXAMPLES

The present invention will now be described in more detail by way of examples, but the present invention is not limited thereto. In the descriptions, parts and percentages are by mass unless otherwise specified.

In the following examples, a latex particle size and a glass transition point (Tg) were measured by the following procedures.

1) Particle Size of Latex

The resulting latex was diluted with distilled water and a 50 volume % average particle size was measured using a laser diffraction scattering type particle size distribution measuring apparatus (LA-910, manufactured by HORIBA, Ltd.).

2) Glass Transition Point of Powder

A test piece measuring 3 mm in thickness×10 mm in width×12 mm in length was made from a modifier for resin and a Tan δ curve was measured by a dynamic viscoelasticity measuring apparatus (DMA983, manufactured by TA Instruments Co.) under the conditions of a temperature rise rate of 2° C./min, and then the temperature corresponding to the transition point was determined as a glass transition temperature.

3) Average Particle Size of Powder

The resulting powder was diluted with distilled water and a 50 volume % average particle size was measured using a laser diffraction scattering type particle size distribution measuring apparatus (Microtrac MT3000, manufactured by NIK-KISO CO., LTD.).

4) Disintegration Property of Powder

The resulting powder was distilled with distilled water and irradiated with ultrasonic wave (40 W×300 sec) using a laser diffraction scattering type particle size distribution measuring apparatus (Microtrac MT3000, manufactured by NIK-KISO CO., LTD.) and then the content of particles having a particle size of 10 μm or less was measured.

Preparation Example 1

Preparation of Modifier for Resin (IM-1)

In a 5 liter flask, 45 parts of pure water, 2.5 parts of butyl acrylate and 0.065 parts of allyl methacrylate were charged and heated to 80° C. while stirring at 250 rpm in a nitrogen atmosphere.

A previously prepared solution of 0.10 parts of potassium persulfate and 5.2 parts of pure water was charge at a time and the first stage soap-free emulsion polymerization was conducted while maintaining for 60 minutes. Then, a mixed solution of 67.5 parts of butyl acrylate, 1.695 parts of allyl methacrylate, 0.6 parts of sodium di 2-ethylhexylsulfosuccinate (manufactured by Kao Corporation under the trade name of PELEX OT-P) and 34.0 parts of pure water was added dropwise over 180 minutes and the second stage emulsion polymerization was conducted while maintaining for one hour to obtain an acrylic rubber polymer latex (R-1). To the resulting latex (R-1), a mixed solution of 29.4 parts of methyl methacrylate, 0.6 parts of ethyl acrylate, 0.4 parts of sodium di 2-ethylhexyl sulfosuccinate and 15.6 parts of pure water was added dropwise over 100 minutes and, after maintaining for one hour, the emulsion polymerization was terminated to obtain a graft copolymer (G-1) latex. The resulting latex had a particle size of 900 nm. The resulting graft copolymer latex was sprayed by a pressure nozzle type using a spray dryer and the resulting microdroplets were dried at a hot-air inlet temperature of 180° C. to obtain a modifier for resin (IM-1).

The resulting powder had an average particle size of 43 μm. The powder particles had a disintegration property of 64%. The rubber moiety had a glass transition point of −23° C. and the graft moiety had a glass transition point of 86° C.

Preparation Example 2

Preparation of Modifier for Resin (IM-2)

In a 5 liter flask, 88 parts of pure water, 5 parts of butyl acrylate and 0.125 parts of allyl methacrylate were charged and heated to 80° C. while stirring at 250 rpm in a nitrogen atmosphere. A previously prepared solution of 0.10 parts of potassium persulfate and 5.2 parts of pure water was charge at a time and the first stage soap-free emulsion polymerization was conducted while maintaining for 60 minutes. Then, a mixed solution of 65 parts of butyl acrylate, 1.625 parts of allyl methacrylate, 0.6 parts of sodium di 2-ethylhexylsulfosuccinate and 34.0 parts of pure water was added dropwise over 180 minutes and the second stage emulsion polymerization was conducted while maintaining for one hour to obtain an acrylic rubber polymer latex (R-2). To the resulting latex (R-4), a mixed solution of 25.4 parts of methyl methacrylate, 0.6 parts of ethyl acrylate, 4 parts of glycidyl methacrylate, 0.4 parts of sodium di 2-ethylhexyl sulfosuccinate and 15.6 parts of pure water was added dropwise over 100 minutes and, after maintaining for one hour, the emulsion polymerization was terminated to obtain a graft copolymer (G-2) latex. The resulting latex had a particle size of 600 nm. The resulting graft copolymer latex was sprayed by a pressure nozzle type using a spray dryer and the resulting microdroplets were dried at a hot-air inlet temperature of 180° C. to obtain a modifier for resin (IM-2). The resulting powder had an average particle size of 38 μm. The powder particles had a disintegration property of 57%. The rubber moiety had a glass transition point of −25° C. and the graft moiety had a glass transition point of 83° C.

Preparation Example 3

Preparation of Modifier for Resin (IM-3)

To the resulting latex (R-2) obtained in Preparation Example 2, a mixed solution of 28.4 parts of methyl methacrylate, 0.6 parts of ethyl acrylate, 0.75 parts of allyl methacrylate, 1 part of glycidyl methacrylate, 0.4 parts of sodium di 2-ethylhexyl sulfosuccinate and 15.6 parts of pure water was added dropwise over 100 minutes and, after maintaining for one hour, the emulsion polymerization was terminated to obtain a graft copolymer (G-3) latex. The resulting latex had a particle size of 610 nm. The resulting graft copolymer latex was sprayed by a pressure nozzle type using a spray dryer and the resulting microdroplets were dried at a hot-air inlet temperature of 180° C. to obtain a modifier for resin (IM-3). The resulting powder had an average particle size of 60 μm. The powder particles had a disintegration property of 55%. The rubber moiety had a glass transition point of −25° C. and the graft moiety had a glass transition point of 88° C.

Preparation Example 4

Preparation of Modifier for Resin (IM-4)

In an autoclave, 80 parts of 1,3-butadiene, 20 parts of styrene, 4.5 parts of divinylbenzene, 3 parts of semihardened beef tallow fatty acid potassium, 0.2 parts of anhydrous sodium sulfate, 0.3 parts of cumene hydroperoxide, 0.2 parts of dextrose, 0.003 parts of ferrous sulfate, 0.3 parts of sodium pyrophosphate decahydrate and 220 parts of distilled water were charged and reacted at 52° C. while stirring for 8 hours to obtain a rubber polymer latex (R-3). 65 Parts of the resulting rubber copolymer latex (R-3), 0.3 parts of potassium alkenyl succinate, 0.3 parts of Rongalite and distilled water were charged in a flask in which the atmosphere was replaced by nitrogen and, after maintaining the inner temperature at 70° C., a mixture of 30.6 parts of methyl methacrylate, 5.4 parts of ethyl acrylate and 0.375 parts of t-butyl hydroperoxide was added dropwise over 50 minutes, followed by maintaining for one hour in the first stage. In the presence of the polymer obtained in the above stage, a mixture of 44 parts of styrene and 0.375 parts of t-butyl hydroperoxide was continuously added over one hour, followed by maintaining for 100 minutes in the second stage. In the presence of the polymers obtained in the first and second stages, a mixture of 20 parts of methyl methacrylate and 0.375 parts of t-butyl hydroperoxide was continuously added dropwise over 15 minutes and, after maintaining for 90 minutes, the polymerization was terminated to obtain a graft copolymer latex (G-4) in the third stage. The resulting latex had an average particle size of 95 nm. The graft copolymer latex was coagulated by adding dropwise in hot water of aluminum sulfate, separated, washed and then dried at 75° C. for 16 hours to obtain a powder. The resulting powder was freeze ground into fine powders with liquid nitrogen and particles having a particle size of more than 250 μm were removed by screening to obtain a modifier for resin (IM-4). The resulting powder had an average particle size of 92 μm. The powder particles had a disintegration property of 2%. The rubber moiety had a glass transition point of −41° C. and the graft moiety had a glass transition point of 81° C.

The measurement results of the average particle size of the latex use in the preparation of the resulting modifiers for resin (IM1 to 4), the average particle size of the modifier for resin powder before and after irradiation with ultrasonic wave, the content of particles having an average particle size of 10 μm or less and the glass transition point are shown in Table 1.

TABLE 1

| | Average particle size of latex [nm] | Average particle size of powder | | | | Glass transition point [° C.] | |
| --- | --- | --- | --- | --- | --- | --- | --- |
| | | Before irradiation with ultrasonic wave | | After irradiation with ultrasonic wave (40 W × 300 sec) | | | |
| | | Content of particles having an average size of 10 μm or less [%] | Average particle size [μm] | Content of particles having an average size of 10 μm or less [%] | Average particle size [μm] | Rubber moiety | Shell moiety |
| IM-1 | 900 | 1 | 43 | 64 | 4 | −23 | 86 |
| IM-2 | 600 | 3 | 38 | 57 | 7 | −25 | 88 |
| IM-3 | 610 | 0 | 60 | 55 | 8 | −25 | 88 |
| IM-4 | 95 | 0 | 92 | 2 | 75 | −41 | 81 |

Examples 1 to 5 and Comparative Examples 1 to 2

100 parts by mass of a curable resin was mixed with each modifier for resin in the amount shown in Table 2 to obtain sheet-like formed test pieces. Using the resulting test pieces, Izod impact strength and dispersibility of the modifier were evaluated.

In these examples, 100 parts of a bisphenol A type epoxy resin (ADEKA RESIN EP-4100E, manufactured by Asahi Denka Co., Ltd.), 85 parts of tetrahydromethylphthalic anhydride (ADEKA HARDENER EH-3326, manufactured by Asahi Denka Co., Ltd.) and a modifier for resin in the amount described in Table 2 were stirred at 60° C. using a stirrer at 150 rpm for 90 minutes and then 1 part of N-benzyl-2-methylimidazole was added. After mixing with stirring, the resulting composition was filled in a mold and heated at 80° C. for 2 hours, then at 120° C. for 6 hours to obtain test pieces. Evaluation was conducted by the following procedures.
(1) Impact Strength
A sheet-like test piece was formed, cut and then evaluated in accordance with ASTM D256.
(Thickness: ¼ inch, Unit: J/m)
(2) Dispersibility
Dispersion state (coagulation state) of a modifier for resin on the surface of a sheet-like test piece was visually evaluated.

B: Coagulate of rubber is not observed.
D: Coagulate of rubber is observed.

TABLE 2

|  |  | Examples | | | | | Comparative Examples | |
|---|---|---|---|---|---|---|---|---|
|  |  | 1 | 2 | 3 | 4 | 5 | 1 | 2 |
| Curable resin | Epoxy resin | 100 | 100 | 100 | 100 | 100 | 100 | 100 |
| Modifier | IM-1 | — | — | — | — | 10 | — | — |
|  | IM-2 | 5 | 10 | 20 | 30 | — | — | — |
|  | IM-3 | — | — | — | — | — | — | — |
|  | IM-4 | — | — | — | — | — | — | 10 |
| Physical properties | Izod impact strength [J/m] | 19 | 22 | 29 | 34 | 28 | 11 | 14 |
|  | Dispersibility | B | B | B | B | B | — | D |

(1) Measurement of Energy Release Rate of Cured Resin

Each of the epoxy resin compositions was cast between glass plates, into which a 3 mm thick spacer is interposed, and then cured with heating in a hot air dryer under the conditions at 130° C. for one hour to obtain a 2 mm thick cured resin sheet. With respect to this cured resin sheet, test pieces were made in accordance with ASTM D5045 (SENB method) to obtain an energy release rate GIc of the cured resin. At this time, the cutting portion was provided with a notch using a cutter.

(3) Measurement of Tg of Cured Resin

Each of the epoxy resin compositions was cast between glass plates, into which a 2 mm thick spacer is interposed, and then cured with heating in a hot air dryer under the conditions at 130° C. for one hour to obtain a 2 mm thick cured resin sheet. With respect to this cured resin sheet, a peak temperature of a loss tangent Tan δ as measured by a rheometer (manufactured by Rheometrix Corp under the trade name of RDA-700) under the conditions of a temperature rise rate of 10° C./min and a measuring frequency of 10 radians per second was taken as a glass transition temperature Tg of the cured resin.

TABLE 3

|  |  | Examples | | | | | | Comparative Examples |
|---|---|---|---|---|---|---|---|---|
|  |  | 6 | 7 | 8 | 9 | 10 | 11 | 3 |
| Epoxy resin | EP828 | 30 | 30 | 30 | 30 | 30 | 30 | 30 |
|  | EP1002 | 40 | 40 | 40 | 40 | 40 | 40 | 40 |
|  | AER4152 | 30 | 30 | 30 | 30 | 30 | 30 | 30 |
|  | DICY | 5 | 5 | 5 | 5 | 5 | 5 | 5 |
|  | DCMU | 4 | 4 | 4 | 4 | 4 | 4 | 4 |
| Modifier | IM-1 | — | — | — | — | — | — | — |
|  | IM-2 | 5 | 10 | 20 | — | — | — | — |
|  | IM-3 | — | — | — | 5 | 10 | 20 | — |
|  | IM-4 | — | — | — | — | — | — | — |
| Physical properties of cured resin | GIc [J/m²] | 720 | 832 | 968 | 696 | 1003 | 1357 | 365 |
|  | Glass transition temperature [° C.] | 142 | 142 | 142 | 142 | 143 | 143 | 145 |

Examples 6 to 11 and Comparative Example 3

30 parts of a bisphenol A type epoxy resin (manufactured by Japan Epoxy Resins Co., Ltd. under the trade name of EPIKOTE 828), 40 parts of a bisphenol A type epoxy resin (EPIKOTE 1002, manufactured by Japan Epoxy Resins Co., Ltd.), 30 parts of an oxazolidone ring-containing epoxy resin (manufactured by Asahi Kasei Corporation under the trade name of AER4152), 5 parts of dicyandiamide (DICY, manufactured by Japan Epoxy Resins Co., Ltd.), 4 parts of 3,4-dichlorophenyl-N,N-dimethylurea (DCMU, manufactured by Hodogaya Chemical Co., Ltd.) and each modifier for resin in the amount show in Table 3 were mixed in a flask using Three-One Motor and a stirring bar to obtain epoxy resin compositions. The resulting Compositions were evaluated by the following procedures.

Examples 12 to 13 and Comparative Example 4

Preparation of Clear Coating Material for Evaluation of Sag

In a 500 mL stainless steel vessel, 90 parts of a modifier for resin and 210 parts of xylene were charged and stirred at 2000 rpm for 10 minutes using a disper stirrer to obtain a xylene dispersion having a resin solid content of 30% of a modifier for resin.

In a 500 mL four-necked flask equipped with a thermometer, a stirrer and a condenser, 180 parts of xylene was added and 120 parts of a solid acrylic resin (BR-73, manufactured by Mitsubishi Rayon Co., Ltd.) was slowly added. After heating to 50° C. in a hot water bath and stirring for one hour, a xylene solution having a resin solid content of 40% of an acrylic resin was obtained.

In a 500 mL stainless steel vessel, 250 parts of the 40% xylene solution of the acrylic resin prepared in the above preparation example was charged and the xylene dispersion was added so as to add the modifier for resin in the amount described in Table 5 (for example, 55 parts of a 30% xylene dispersion of a modifier for resin is added in case of 16.5 parts of the modifier for resin), followed by stirring. The resulting mixture was diluted with xylene so as to adjust the viscosity within a range from 16 to 17 seconds with Zahn cup No. 4 to obtain a clear coating material for evaluation of sag. The resulting coating material was evaluated by the following procedure. The results are shown in Table 4.

(1) Evaluation of Sag

On a glass plate (thickness: 2 mm) measuring 120 mm×120 mm, the clear coating material prepared in the above preparation example was coated using a sag tester. Immediately, the test piece was vertically stood and was allowed to stand for 30 minutes. The maximum film thickness at which the coating material does not flow was recorded and then evaluated by the following criteria. As the sag tester, a sag tester manufactured by TAIYU KIZAI CO., LTD. (9 mm, 25 to 250 μm, space: 2 mm) was used 25 to 50 μm: D
75 to 100 μm: C
125 to 175 μm: B
200 to 250 μm: A

TABLE 4

|  |  | Examples | | Comparative Examples |
|---|---|---|---|---|
|  |  | 12 | 13 | 4 |
| Acrylic resin | BR-73 | 100 | 100 | 100 |
| Modifier | IM-1 | — | — | — |
|  | IM-2 | 16.5 | 33.0 | — |
|  | IM-3 | — | — | — |
|  | IM-4 | — | — | — |
| Sag |  | B (125 μm) | B (150 μm) | D (50 μm) |

Examples 14 to 15 and Comparative Example 5

Preparation of White Coating Material for Evaluation of Impact Resistance

In a 300 mL glass bottle with a lid, 250 parts of the 40% xylene solution of the acrylic resin prepared in the above preparation example was charged and 83.5 parts of titanium oxide (CR-90, manufactured by Ishihara Sangyo Kaisya, Ltd.) and 25 parts of dioctyl phthalate was added, followed by mixing. After dispersing in a planet ball mill for one hour, the 30% xylene solution of the modifier was added so as to add the modifier for resin in the amount described in Table 5 (for example, 83.5 parts of a 30% xylene dispersion of a modifier is added in case of 25 parts of the modifier for resin). The resulting mixture was diluted with xylene so as to adjust the viscosity within a range from 12 to 13 seconds with Ford cup No. 4 to obtain a white coating material. The resulting coating material was evaluated by the following procedure. The results are shown in Table 5.

(1) Evaluation of Impact Resistance

The white coating material prepared in the above preparation example was spray coated on a test base material (a base material measuring 0.8×70×150 mm obtained by subjecting a phosphated steel sheet to electrodeposition coating, intermediate coating and water polishing treatment (Dull Steel Sheet D-7, manufactured by Nippon Route Service Co.), followed by standing at room temperature for 20 minutes and further drying at 60° C. for one hours to obtain a test piece having a dry thickness of 50 μm. In the evaluation of impact resistance, a DuPont type impact deformation tester was used and a ½ inch weight of 500 g was used. The impact resistance was evaluated (JIS K400) by the height of the weight, at which cracking or peeling of the coating film is not observed, according to the following criteria.

25 cm or less: D
30 to 35 cm: C
40 to 45 cm: B
50 cm or more: A

TABLE 5

|  |  | Examples | | Comparative Examples |
|---|---|---|---|---|
|  |  | 14 | 15 | 5 |
| Acrylic resin | BR-73 | 100 | 100 | 100 |
| Titanium oxide |  | 83.5 | 83.5 | 83.5 |
| Dioctyl phthalate |  | 25.0 | 25.0 | 25.0 |
| Modifier | IM-1 | — | — | — |
|  | IM-2 | 12.5 | 25.0 | — |
|  | IM-3 | — | — | — |
|  | IM-4 | — | — | — |
| DuPont type impact deformation test |  | A (>50 cm) | A (>50 cm) | D (25 cm) |

INDUSTRIAL APPLICABILITY

The modifier for resin of the present invention can be well dispersed by adding to various thermoplastic resins and curable resins thereby to impart high impact resistance.

The invention claimed is:

1. A resin composition, comprising:
   (a) 1 to 40% by mass, based on the total mass of the resin composition, of a modifier comprising powder particles, wherein
   (1) the powder particles are composed of agglomerates of particles of a graft copolymer, wherein the graft copolymer has a core-shell structure composed of a rubbery polymer as a trunk polymer and having grafted thereon a graft polymerizable vinyl-based monomer and the particles of the graft copolymer have an average particle size of 600 nm or more,
   (2) the powder particles have an average particle size of 20 μm or more,
   (3) the amount of powder particles having a particle size of 10 μm or less account for less than 30% by mass of the modifier, based on 100% by mass of the modifier,
   (4) when the modifier is irradiated with an ultrasonic wave of 40 W for 5 minutes, the amount of powder particles having a particle size of 10 μm or less is more than 30% by mass of the modifier, based on 100% by mass of the modifier, and
   (b) 99 to 60% by mass, based on the total mass of the resin composition, of a curable epoxy resin.

2. The resin composition of claim 1, wherein the modifier consists essentially of the powder particles.

3. The resin composition of claim 2, wherein the powder particles consist essentially of the graft copolymer.

4. The resin composition of claim 1, wherein the modifier consists of the powder particles and the powder particles consist of the graft copolymer.

5. A molded article which is produced by molding the resin composition of claim 1.

6. The resin composition according to claim 1,
wherein the modifier is obtained by a process comprising:
adding one or more copolymerizable vinyl-based monomers to a rubber polymer latex,
graft-polymerizing the copolymerizable vinyl-based monomers and the rubber polymer latex to obtain a graft copolymer latex, wherein the graft copolymer latex has an average particle size of 600 nm or more, and
spray-drying the graft copolymer latex.

* * * * *